(12) United States Patent
Owens

(10) Patent No.: US 6,304,083 B1
(45) Date of Patent: Oct. 16, 2001

(54) MAGNETIC FIELD SENSOR WITH COLOSSAL MAGNETO-RESISTIVE MATERIAL CONTAINED WITHIN THE COIL OF AN OSCILLATOR

(75) Inventor: Frank Owens, Denville, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/153,674

(22) Filed: Sep. 15, 1998

(51) Int. Cl.[7] .................. G01R 33/02; G01R 33/09; G01V 3/10; G01V 3/40; G11B 5/127
(52) U.S. Cl. ................... 324/258; 324/236; 324/252; 324/260; 324/327; 324/345; 324/249; 235/449; 331/65; 360/110; 360/326
(58) Field of Search ............................. 324/236, 244, 324/249, 252, 258, 260, 327, 345; 331/65; 360/110, 111, 113, 123, 125–127, 318, 326; 340/551; 235/449

(56) References Cited

U.S. PATENT DOCUMENTS

| | | | |
|---|---|---|---|
| 3,239,754 | * | 3/1966 | Odom, Jr. et al. ............... 324/249 X |
| 3,416,072 | * | 12/1968 | Fussell et al. ......................... 324/249 |
| 3,443,213 | * | 5/1969 | Bader et al. ........................... 324/249 |
| 4,464,691 | * | 8/1984 | Sawazaki et al. .................... 360/111 |
| 5,792,569 | * | 8/1998 | Sun et al. ......................... 324/252 X |
| 5,872,368 | * | 2/1999 | Osofsky et al. ........................ 257/34 |

OTHER PUBLICATIONS

Owens, Frank J., Giant magneto radio frequency absorption in magneto-resistive materials $La_{0.7}(Sr,Ca)_{0.3}MnO_3$, J. Appl. Phys. 82 (86) pp 3054–3057. Sept. 15, 1997.*

* cited by examiner

Primary Examiner—Gerard Strecker
(74) Attorney, Agent, or Firm—Robert C. Beam; John F. Moran; Michael C. Sachs

(57) ABSTRACT

Sensors, systems and methods for measuring magnetic field strengths in both AC and DC magnetic fields by using CMR material in tunable, radio-frequency LC oscillators are disclosed.

10 Claims, 3 Drawing Sheets

FIG. 1A1
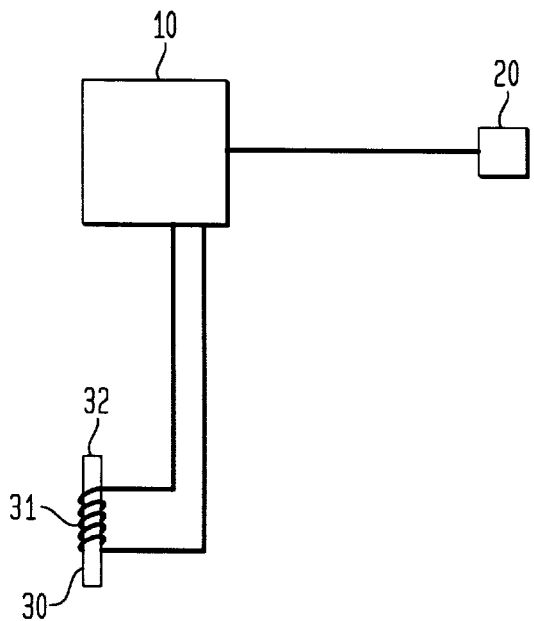
FIG. 1A2
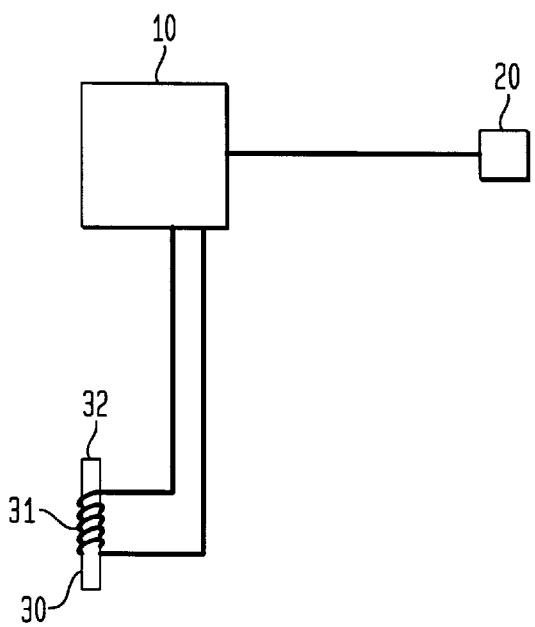
FIG. 1A3
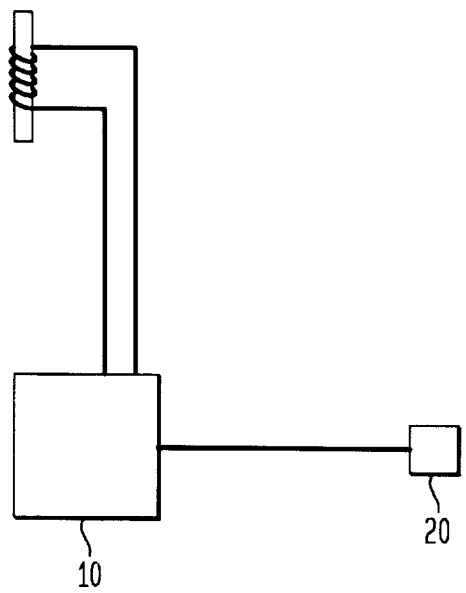
FIG. 1A4
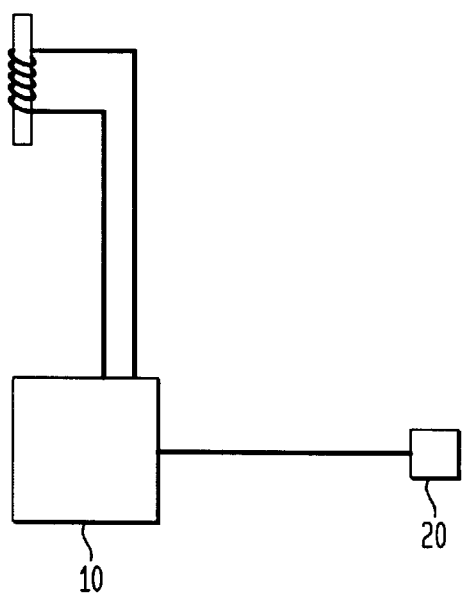

MAGNETIC FIELD SENSOR WITH COLOSSAL MAGNETO-RESISTIVE MATERIAL CONTAINED WITHIN THE COIL OF AN OSCILLATOR

STATEMENT OF GOVERNMENT INTEREST

The Government of the United States of America has certain rights and licenses in this invention.

BACKGROUND OF INVENTION

Materials known as Colossal Magneto-Resistive (CMR) or Giant Magneto-Resistive materials have been studied for their magnetic properties in both thin film and bulk forms. One such study, "Low-Field Giant Magneto-resistance at Microwave Frequencies", Schmadel et al, Dept. of Physics and Center for Superconductivity Research, University of Maryland, College Park, MD 20742-4111, indicates that LBMO in the microwave frequencies may be useful in device applications. This presentation is representative of the research interest in the application of CMR materials to such devices as semiconductors and the like.

SUMMARY OF INVENTION

Magnetic sensors and methods using the sensors are used in a wide variety of applications. The sensors are used in such diverse applications as mapping the magnetic fields of the earth and security devices. There is a need for sensors that are low cost and accurate and that can be direct replacements for sensors in existing apparatus such as magnetometers. As described in the publication, "Giant magneto radio frequency absorption in magneto-resistive materials, etc., Frank J. Owens, J. App. Phys., 82 (6), Sep. 15, 1997, certain colossal magneto-resistance (CMR) materials can be used at and above room temperature for these purposes.

The invention is directed to measuring magnetic fields with sensors which have CMR materials that are ferromagnetic at temperatures that include from below about room temperature to about 370 degrees Kelvin. In one aspect it is in the form of apparatus such as sensors and systems which are combinations of sensors and external magnetic fields. The strength of the magnetic field is measured. In another aspect, it is methods and processes which use the sensors to determine the strength of external magnetic fields. The sensor contains at least one tunable, radio-frequency LC oscillator circuit. It has a frequency range which includes from about 1 KHz to about 10 MHz. A Colossal Magneto-Resistance (CMR) material is contained within the inductance coil of the LC circuit. This CMR material is ferromagnetic in a temperature range which includes about or above room temperature. It has a permeability sufficiently sensitive to external magnetic fields so that the presence of the field will produce a discernable change in the inductance of the LC circuit. This produces a corresponding change in the frequency of the LC oscillator. This frequency shift is correlated to the strength of the external magnetic field. An important aspect of the invention is that the strength of the magnetic field is measured by tuning with the LC circuit. Tuning of an LC circuit is recognized as one of the simplest and most accurate measurement techniques which are available. Therefore, the invention provides an accurate and simple apparatus and procedure to measure magnetic fields.

The methods and processes of the invention have the advantages that they can accurately measure low strength external magnetic fields, they can be practiced at ambient temperature without auxiliary cooling, and they are relatively inexpensive. This lends itself to mass production and systems using low cost sensors.

BRIEF DESCRIPTION OF FIGURES

FIG. 1A is a schematic of an array of tunable, radio frequency LC circuits with CMR material contained within the inductance coil of each circuit. The array can be used in sensors according to the invention.

DETAILED DESCRIPTION OF INVENTION AND FIGURES

Figure 1:
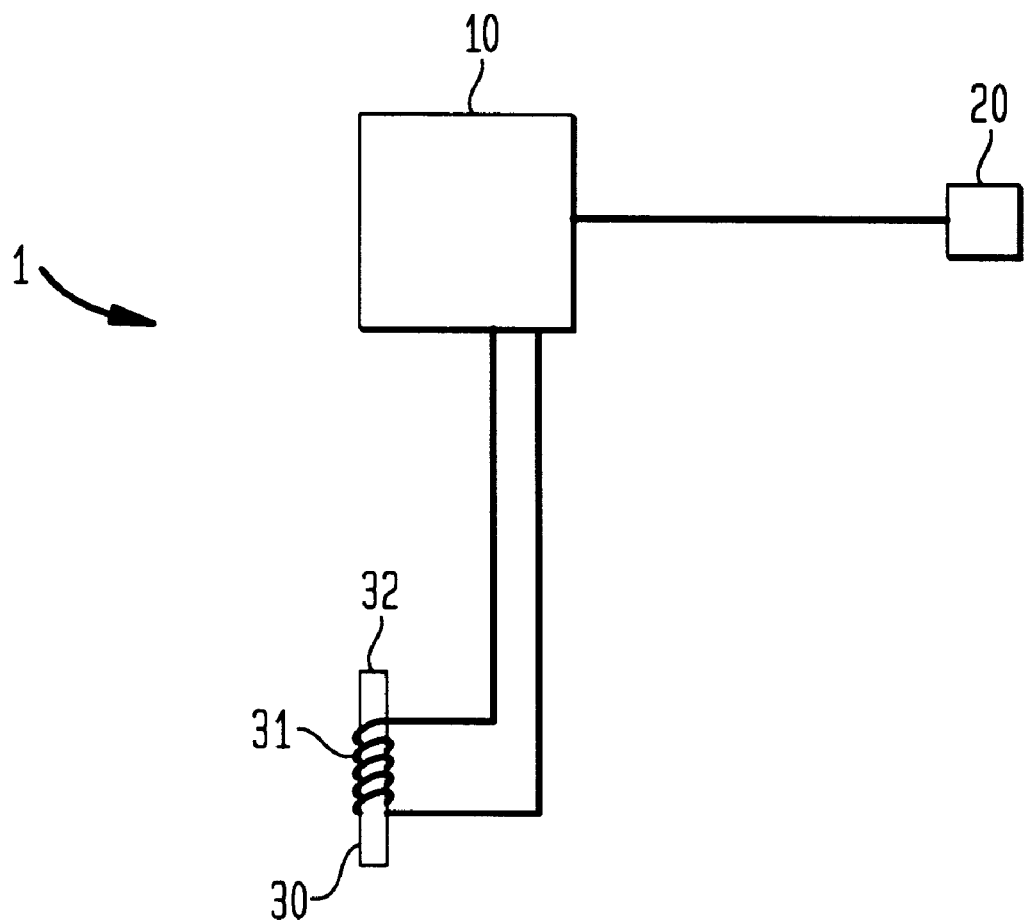
FIG. 1 is a schematic of a tunable, radio frequency LC circuit with CMR material contained within an inductance coil of the circuit. The circuit can be used in sensors according to the invention.

In the invention, individual sensors are constructed with tunable, radio-frequency LC circuits that contain CMR material in the inductance coil. This material is ferromagnetic at about and above room temperature. The invention is used to measure strengths of external magnetic fields. Referring to FIG. 1, a schematic tunable LC circuit (1) is shown. It contains a tunable, radio-frequency (RF) LC oscillator (10) with a read out device for reporting frequency shifts such as a frequency meter (20). There is a probe section (30) which contains the inductance coil (31) of the LC circuit and the CMR material (32) is contained within the inductance coil (31).

In this example, the sensor is a single LC oscillator and frequency meter. It is a tunnel diode which employs a germanium diode powered by a 1.5 volt battery. The inductance coil (31) is a long thin wire wound around a thin glass cylinder. The sintered CMR material (32) is inside the cylinder. The particular composition is La Sr MnO. This undergoes a ferromagnetic transition at 370 degrees Kelvin. When an external magnetic field is brought into the region of the probe, a discernable change in inductance occurs. The article "Giant magneto radio frequency absorption in magneto-resistive materials $La_{0.7}(Sr,Ca)_{0.3}MnO_3$ is incorporated by reference herein. This reference contains additional details on the construction and use of the sensors for measuring external DC magnetic fields and illustrates the determination of ferromagnetic temperature range and the relationship of frequency shift to magnetic field strength for external DC field.

FIG. 1A is a schematic of an array of tunable, radio frequency LC circuits with CMR material contained within the inductance coil of each circuit. The array can be used in sensors according to the invention.

Figure 2:
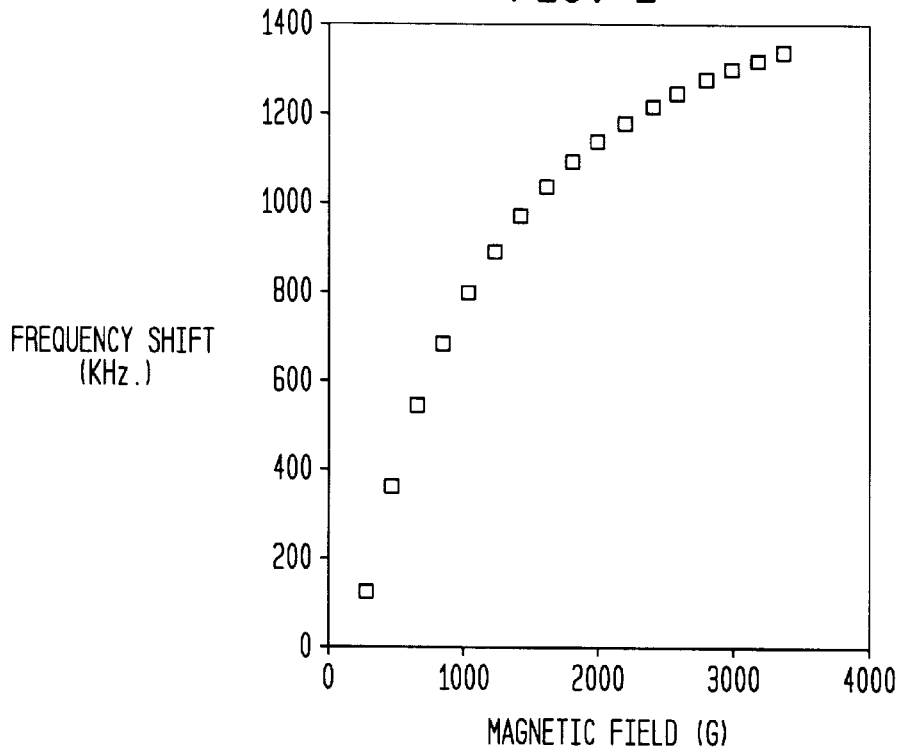
FIG. 2 is a graph of frequency shift (vertical axis) versus magnetic field strength (horizontal axis). The LC circuit containing CMR material in the inductance coil is as described in FIG. 1. The horizontal axis is the magnetic field strength of an external DC magnetic field. The frequency of the LC circuit was originally at 1000 Hz. The curve is the relationship of frequency shift to magnetic field strength over the range of from about 100 Gauss to about 4000 Gauss.

FIG. 2 illustrates a system which combines the effect of an external DC magnetic field and the response of the sensor of the type described in FIG. 1. The oscillator has a basic 10 MHz signal. Permanent magnets of several different strengths are brought to the probe region and the LC circuit is tuned to obtain the best response for each individual magnet. The typical frequency shift versus field strength for the external DC magnet is as shown in FIG. 2. With a stable oscillator, field strengths as low as 0.001 Gauss could be measured.

Figure 3:
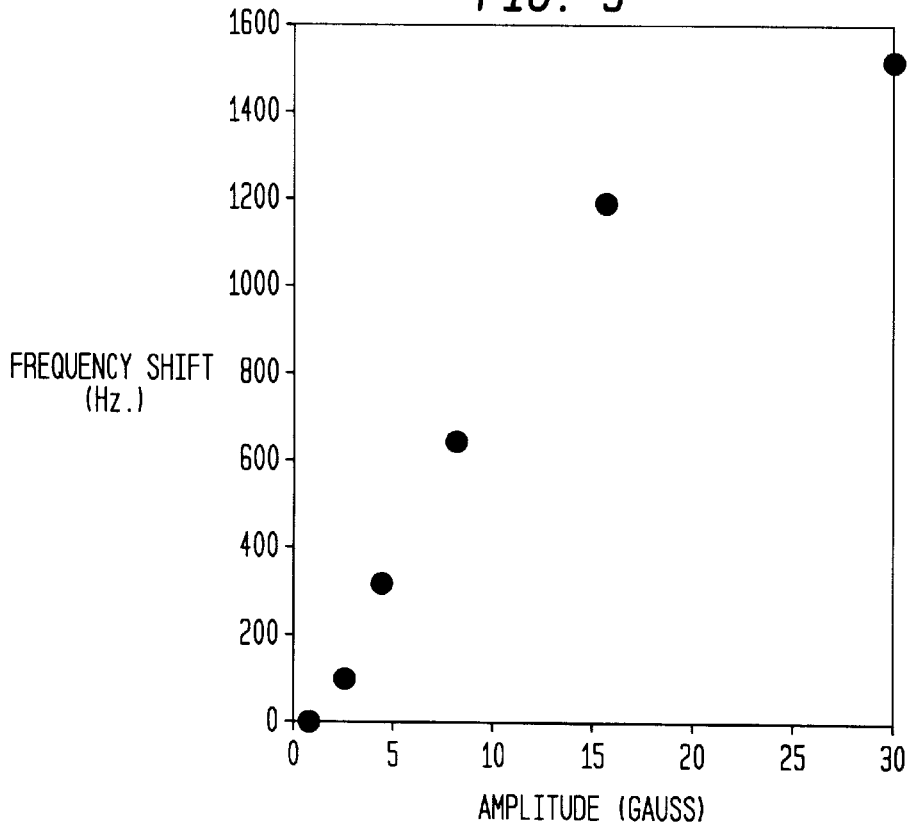
FIG. 3 is a graph of frequency shift (vertical axis) versus magnetic field strength (horizontal axis). The LC circuit containing CMR material in the inductance coil is as described in FIG. 1. The horizontal axis is the magnetic field strength of an external AC magnetic field. The frequency of the LC circuit was originally at 1000 Hz. The curve is the relationship of frequency shift to magnetic field strength over the range of from about 1 Gauss to about 30 Gauss.

FIG. 3 illustrates a system in which the effect of an external AC magnetic field is combined with the response of a sensor of the type described in FIG. 1. The oscillator has a basic 10 MHz signal. The external AC field has a frequency of 1 KHz. As shown, the magnetic field strength varied from about 1 to about 30 Gauss. The derivative of the frequency shift as a function of magnetic strength is approximately linear from about 1 to about 17 Gauss. The average slope in this range is about 0.0125 G/Hz.

The invention can be used with both AC and DC magnetic fields. The field can be AC, then DC, then AC or it can be entirely AC or entirely DC. Because of its versatility, the invention can be used in low strength magnetic fields like the natural field of the earth, it can be used for ore and petroleum detection, for metal detection such as minefield simulation and mine detection and for security systems such as metal detectors, airport security building security, magnetic card readers, magnetic tag readers and recording heads, see U.S. Pat. No. 5,027,709, Glenn B. Sleagle, Jul. 2, 1991, FIG. 4; U.S. Pat. No. 5,719,501, Feb. 17, 1998, FIGS. 3A and 3B. Process control and quality control systems can utilize the invention, such as shown in U.S. Pat. No. 5,321,361, William L. Goodman, Jun. 14, 1994, FIGS. 1–6, 9–27. The sensors, systems and methods of this invention can be substituted for the conventional sensors and magnetometers as are presently available. The advantages of the invention are improved accuracy, lower cost and more versatility. The systems with the sensors can be land borne, airborne or marineborne.

The sensor will have at least one tunable, radio-frequency LC oscillator and that is tunable over the range of about 1 KHz to about 10 MHz. The advantage of the frequency tuning is that it can be done with a high degree of accuracy and can accommodate a wide variety of external DC magnetic field strengths and external AC magnets.

The CMR material is contained within the induction coil of the LC circuit. The CMR will be ferromagnetic in a range that includes at about or above room temperature. This is from about 273 degrees K to about 370 degrees K. For materials that are ferromagnetic in a range that includes room temperature to about 370 degrees K, it can be seen that no external cooling systems will be needed. One type of CMR materials suitable for the invention are known as sintered perovskite. One formula for the perovskites that are ferromagnetic at about or above room temperature is (1−x)La(x)SrMnO$_3$ where x is greater than 0.25. A suitable material has x=0.3; this is ferromagnetic up to about 370 degrees K. The CMR material can be used in the bulk, or as a sintered form. It may also be deposited on thin films and used in that form. A benefit of the high ferromagnetic temperature is that the sensor does not need external cooling for the frequency shift effect to be noticeable. It operates at ambient temperatures well as temperatures below ambient.

The magnetic field strength can be as low as 1 Gauss. The high values are a matter of choice. The sensor may be used alone or in arrays with other sensors. The sensors may be stationary or may be movable such as the systems shown in the patents cited above.

It is intended that the invention includes the equivalent materials, conditions, structures and steps, and variations of such equivalents as are commonly practiced in this field as well as the specific embodiments described above.

I claim:

1. In a sensor that uses frequency tuning over a range of about 1 KHz to about 10 MHz to determine the strength of a magnetic field and which has at least one tunable, radio-frequency LC oscillator with an induction coil, wherein the improvement comprises:

a colossal magnetic resistance (CMR) material contained within said induction coil, the CMR material being ferromagnetic at about or above about room temperature and whose permeability is sufficiently sensitive to external magnetic fields such that the presence of the field will produce a discernable change in the inductance and corresponding frequency of the LC oscillator.

2. The sensor of claim 1 where the frequency change of the oscillator is proportional to the permeability of the CMR material.

3. The sensor of claim 1 being adapted to measure the strength of an external magnetic field selected from an AC magnetic field and combinations of AC and DC magnetic fields.

4. The sensor of claim 1 where the CMR material is a sintered perovskite.

5. The sensor of claim 1 where the CMR material is sintered La$_{1-x}$Sr$_x$MnO$_3$ and x is greater than 0.25.

6. The sensor of claim 1 where the CMR material is sintered La$_{0.7}$A$_{0.3}$MnO$_3$.

7. The sensor of claim 1 where the CMR material is ferromagnetic at up to about 370 degrees Kelvin.

8. In an array of sensors having at least two sensors that use frequency tuning to determine the strength of a magnetic field, each sensor using frequency tuning over a range of about 1 KHz to about 10 MHz to determine the strength of the magnetic field and having at least one tunable, radio-frequency LC oscillator with an induction coil wherein the improvement comprises:

a colossal magnetic resistance (CMR) material contained within said induction coil, the CMR material being ferromagnetic at about or above about room temperature and whose permeability is sufficiently sensitive to external magnetic fields such that the presence of the field will produce a discernable change in the inductance and the corresponding frequency of the LC oscillator.

9. In a compact and sturdy magnetometer having a self contained power source and at least one sensor that uses frequency tuning over a range of about 1 KHz to about 10 MHz to determine the strength of a magnetic field and which has at least one tunable, radio-frequency LC oscillator with an induction coil, wherein the improvement comprises:

a colossal magnetic resistance (CMR) material contained within said induction coil, the CMR material being ferromagnetic at about or above about room temperature and whose permeability is sufficiently sensitive to external magnetic fields such that the presence of the field will produce a discernable change in the inductance and the corresponding frequency of the LC oscillator.

10. In a recording head containing at least one sensor that uses frequency tuning over a range of about 1 KHz to about 10 MHz to determine the strength of a magnetic field and which has at least one tunable, radio-frequency LC oscillator with an induction coil, wherein the improvement comprises:

a colossal magnetic resistance (CMR) material contained within said induction coil, the CMR material being ferromagnetic at about or above about room temperature and whose permeability is sufficiently sensitive to external magnetic fields such that the presence of the field will produce a discernable change in the inductance and the corresponding frequency of the LC oscillator.

* * * * *